United States Patent [19]

Kawamura et al.

[11] Patent Number: 5,635,009
[45] Date of Patent: Jun. 3, 1997

[54] METHOD FOR STICKING AN INSULATING FILM TO A LEAD FRAME

[75] Inventors: Toshio Kawamura; Takashi Suzumura; Makoto Aida; Hiroshi Sugimoto; Shigeharu Takahagi; Yuju Endo; Toshi Sasaki; Hiroyuki Takasaka, all of Ibaraki, Japan

[73] Assignee: Hitachi Cable Ltd., Tokyo, Japan

[21] Appl. No.: 242,544

[22] Filed: May 13, 1994

[30] Foreign Application Priority Data

May 14, 1993 [JP] Japan ................................. 5-113140
May 17, 1993 [JP] Japan ................................. 5-114421

[51] Int. Cl.$^6$ ........................... B32B 31/20; B26D 1/00
[52] U.S. Cl. ............... 156/261; 156/322; 156/518; 83/13; 83/55; 83/684
[58] Field of Search ............................. 156/261, 518, 156/520, 322; 83/15, 55, 682, 684, 685, 13

[56] References Cited

U.S. PATENT DOCUMENTS

| | | | |
|---|---|---|---|
| 4,279,682 | 7/1981 | Hamagami et al. | 156/261 X |
| 4,289,568 | 9/1981 | Trotsky et al. | 156/261 X |
| 4,581,096 | 4/1986 | Sato | 156/261 X |
| 4,862,245 | 8/1989 | Pashby et al. | |
| 4,985,105 | 1/1991 | Masuda | 156/261 |
| 5,507,910 | 4/1996 | Miyajima | 156/261 X |

FOREIGN PATENT DOCUMENTS 1655645  6/1991  U.S.S.R. .

OTHER PUBLICATIONS

Akaro et al., Abstract of SU 1613234, Dec. 7, 1990.

*Primary Examiner*—David A. Simmons
*Assistant Examiner*—M. Curtis Mayes
*Attorney, Agent, or Firm*—Helfgott & Karas, P.C.

[57] ABSTRACT

A method for punching an insulating film is composed of using plural divided punches having a clearance between each two of the divided punches. The clearance absorbs thermal expansion of the divided punches caused by receiving a heat from a heater. A punched insulating film is stuck to a lead frame by being pressed between the divided punches and the heater.

2 Claims, 7 Drawing Sheets

FIG. 2C
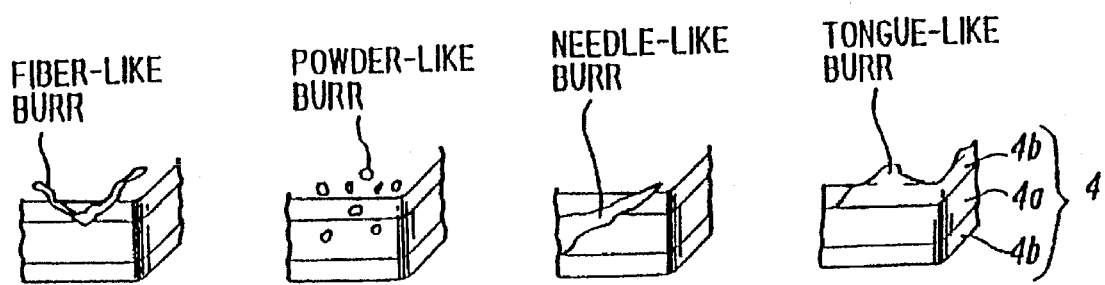
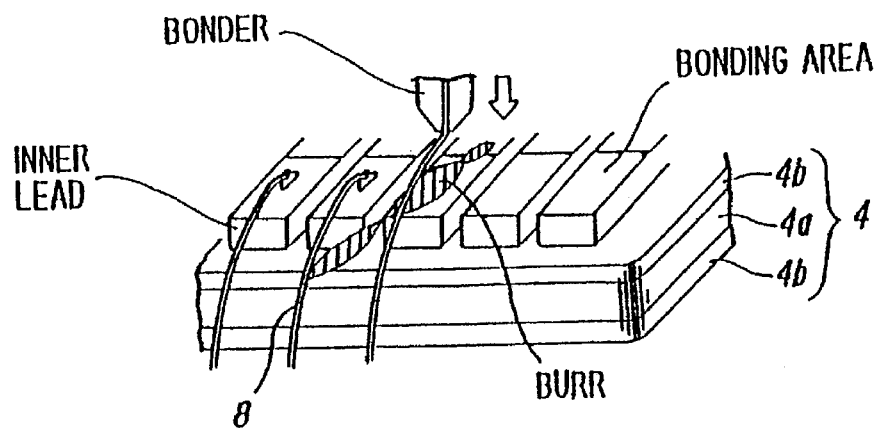

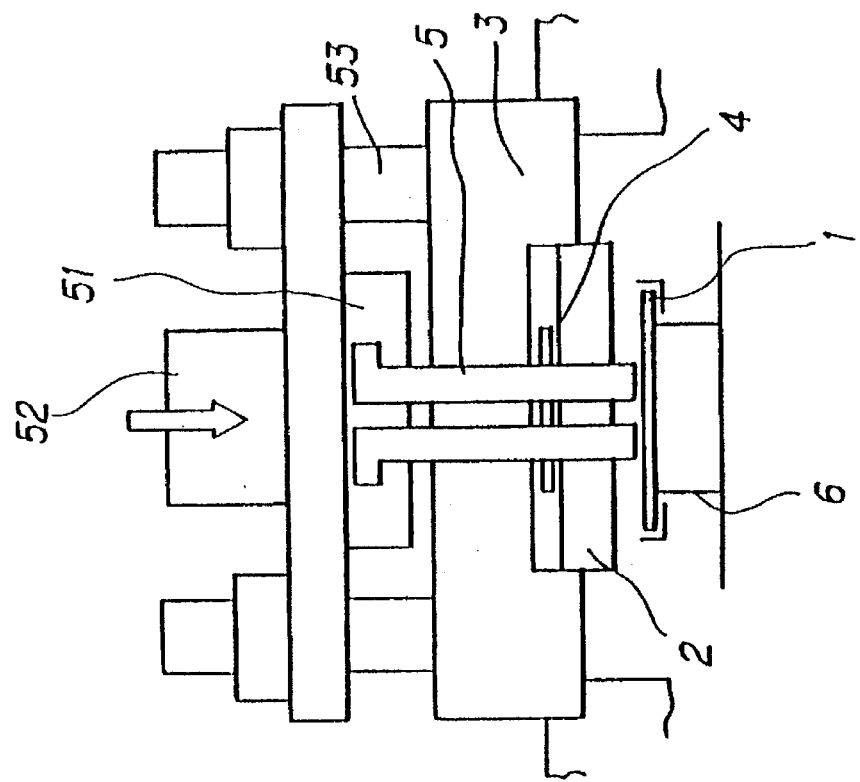
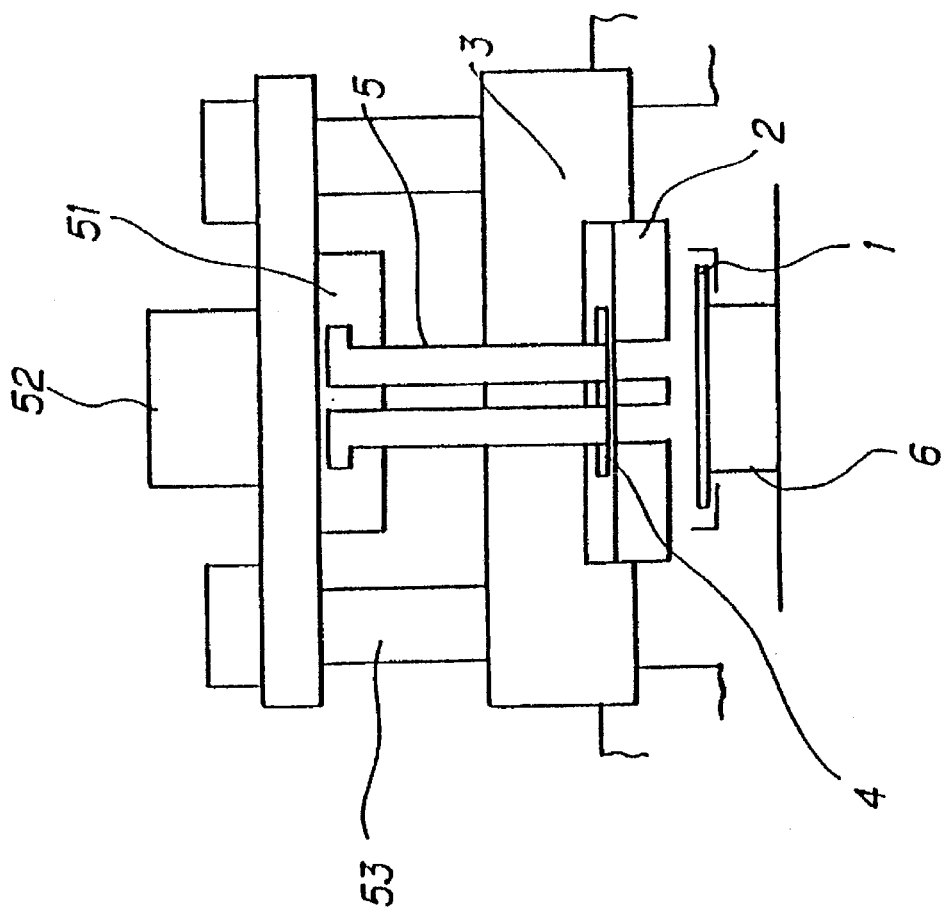

METHOD FOR STICKING AN INSULATING FILM TO A LEAD FRAME

FIELD OF THE INVENTION

The invention relates to a method and an apparatus for sticking an insulating film to a lead frame, and more particularly, to insulating film sticking method and apparatus by which an insulating film is adhesively attached on an inner lead portion of a lead frame by stable sticking characteristics.

BACKGROUND OF THE INVENTION

In accordance with the development of high density mounting technology for LSIs, the number of input and output pins is increased relative to an area of semiconductor chips, so that the number of the semiconductor chips mounted on a circuit board is decreased, and the size of the circuit board is made small. Thus, the high density mounting of LSIs is realized by using a mounting method of, for instance, the lead type or the surface mounting type.

A conventional semiconductor package using a method of "LOC(Lead On Chip)" fabricated by the high density mounting technology comprises a semiconductor chip having electrodes thereon, and a lead frame having leads adhesively attached on the semiconductor chip, wherein the leads are bonded to the electrodes by bonding wires, and the semiconductor chip and the bonded leads are sealed to expose an outer portion of the leads by a packaging resin. In this semiconductor package, the attaching of the leads to the semiconductor chip is conducted by using a punched insulating film having thermally activating adhesive layers on the both surfaces thereof. For this purpose, the punched insulating film is sticked to the leads of the lead frame in advance of a fabrication process for the semiconductor package.

Here, a conventional method for sticking an insulating film to a lead frame will be explained.

In the sticking method, an insulating film is punched to provide a punched insulating film by using a punch and a die cooperating with each other. The punched insulating film is applied on a lead frame which is heated on a heater in accordance with the lowering motion of the punch. Thus, the punched insulating film is adhesively attached on an inner lead portion of the lead frame.

In the LOC type semiconductor package, the punched insulating film is subject to thermal steps such as the wire bonding, the resin sealing, etc. For this reason, the punched insulating film and adhesive layers on the both surfaces must be heat-proof at a temperature ranging 250° to 400° C.

In an experiment similar in condition to the conventional method for sticking an insulating film to a lead frame, when a heat cycle in which a punch having a length of 18.5 mm is heated at a temperature of 400° C. for one and half seconds, and is then cooled for one second is conducted, it is detected in the analysis result by FEM (Finite Element Method) that the punch is burnt with a die in accordance with the thermal expansion of the punch.

Therefore, a clearance is properly set between the punch and the die in the conventional method for sticking an insulating film to a lead frame to avoid the burning of the punch with the die.

In addition to the application of a punched insulating film to the LOC type semiconductor package, it is also used for suppressing the difference of position levels at a tip portion of leads of a lead frame and the position shift of the leads.

For this purpose, the same method as the above described method for sticking an insulating film to a lead frame is used, wherein a punched insulating film is not required to be heat-proof at a temperature of 250° to 400° C., but only to have a heat-proof resistance of approximately 150° C., because the punched insulating film is not used for insulating the lead frame from the semiconductor chip.

In the conventional method for sticking an insulating film to a lead frame, however, there is a disadvantage in that an insulating film is not properly punched to result in deformed edges (burrs and chips) on a punched insulating film, when the punch has a length greater than 13 mm to arise the remarkable influence on a clearance between the punch and the die due to the thermal expansion of the punch. In order to overcome the disadvantage, the punch and the die must be designed to provide a proper clearance therebetween in the thermally expanded state, and the punch must be pre-heated prior to operation.

Further, there is a disadvantage in that a pressing force of the punch on the lead frame is large to deform the punched insulating film, and, in a rare case, the lead frame, as described in detail later.

SUMMARY OF THE INVENTION

Accordingly, it is an object of the invention to provide a method and an apparatus for sticking an insulating film to a lead frame in which the influence of thermal expansion of a punch is eliminated.

It is a further object of the invention to provide a method and an apparatus for sticking an insulating film to a lead frame in which a punched insulating film having no deformed edge is obtained.

It is a still further object of the invention to provide a method and an apparatus for sticking an insulating film to a lead frame in which a pressing force of a punch on a lead frame is appropriately set not to be too large.

According to the invention, a method for sticking an insulating film to a lead frame, comprises the steps of:

punching a thermally adhesive insulating film to provide a punched film by a punch;

heating a lead frame to be a predetermined temperature by a heater; and pressing the punched film on the lead frame on the heater by the punch, the punched film being sticked to the lead frame wherein said punching;

step is carried out together with a step of absorbing thermal expansion of the punch resulted from receiving a heat of the heater.

According to another feature of the invention, an apparatus for sticking an insulating film to a lead frame, comprises:

a punch moving up and down to punch a thermally adhesive insulating film, thereby providing a punched film to be adsorbed on a tip plane of the punch;

a die for placing the thermally adhesive insulating film to be punched cooperatively with the punch; and a heater for heating a lead frame;

wherein the punch is composed of divided punches having a clearance between each two of the divided punches, and the punched film is pressed to be sticked to the lead frame on the heater by the divided punches, while the clearance absorbs thermal expansion of the divided punches resulted from receiving a heat of the heater.

BRIEF DESCRIPTION OF THE DRAWINGS

The invention will be explained in more detail in conjunction with appended drawings, wherein:

FIG. 2C is an explanatory diagram explaining punching burrs which interrupt a bonding wire to be bonded to a lead frame, FIGS. 5A and 5B are explanatory views showing an apparatus for sticking an insulating film to a lead frame in a first preferred embodiment according to the invention.

DESCRIPTION OF THE PREFERRED EMBODIMENTS

Before explaining a method and an apparatus for sticking an insulating film to a lead frame in the preferred embodiments according to the invention, the aforementioned conventional method for sticking an insulating film to a lead frame will be again explained.

Figure 1:
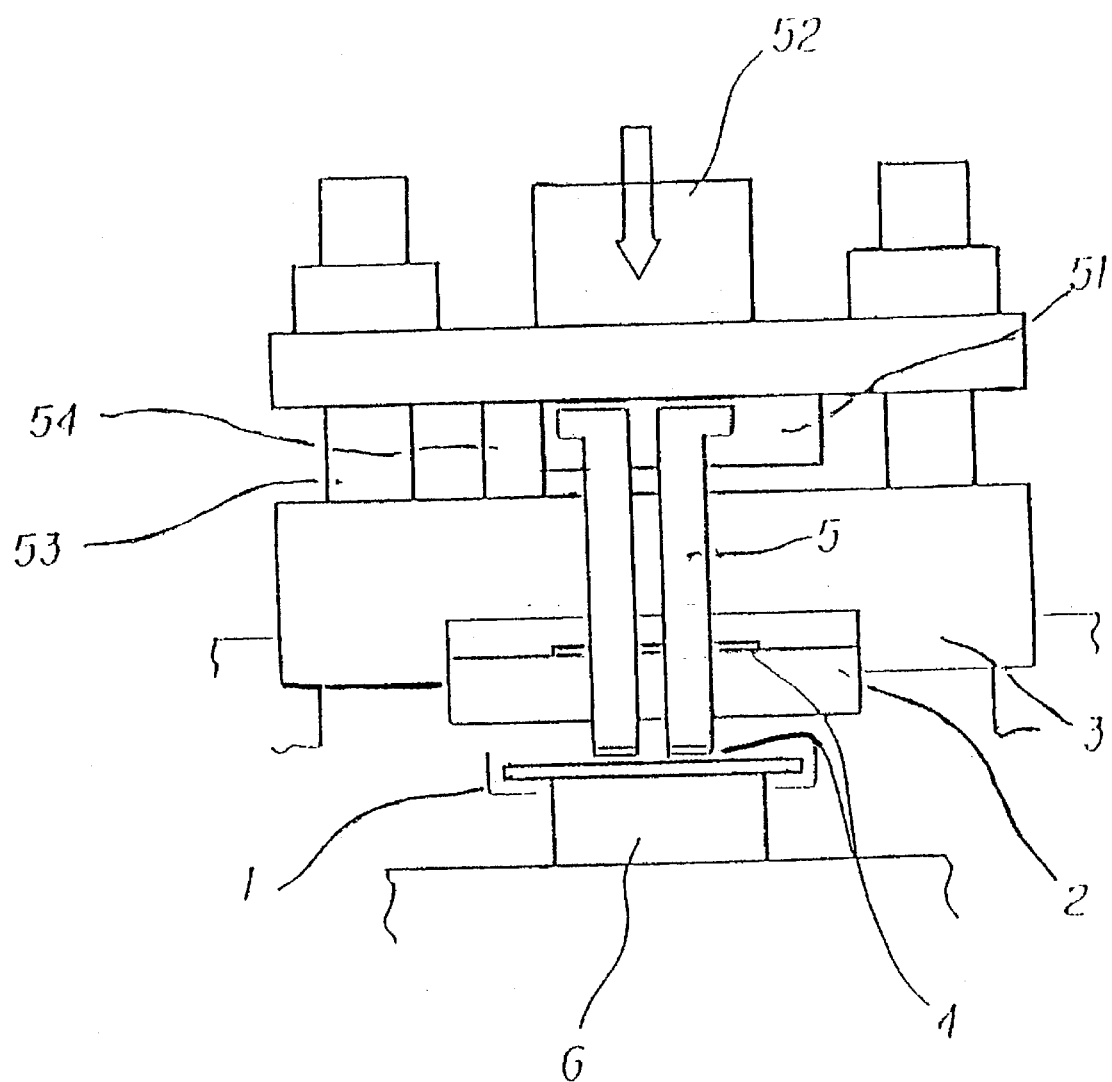
FIG. 1 is an explanatory view showing a conventional apparatus for sticking an insulating film to a lead frame.

FIG. 1 shows an apparatus to be used for the conventional method for sticking an insulating film to a lead frame. The apparatus comprises a die 2 for placing an insulating film 4 thereon, punches 5 for punching the insulating film 4 and adsorbing punched insulating films 4 on the tip plane by vacuum, a punch guide 3 for guiding the punches 5 through guide apertures thereof, a heater 6 for heating a lead frame 1 placed thereon to be a predetermined temperature, a punch holder 51 for holding the punches 5, a shank 52 for vertically moving the punches 5 up and down, and a cylinder 53 for generating a moving force to be applied to the shank 52. In some use, a spacer 54 may be provided.

In operation, the insulating film 4 is transferred on the die 2 by an transfer apparatus (not shown), when the punches 5 take an upper position. At the same time, the lead frame 1 is also transferred on a predetermined position on the heater 6. Then, the punches 5 are moved down to punch the insulating film 4, so that the punched insulating films 4 adsorbed on the tip plane of the punches 5 by vacuum are lowered to be pressed on the heated lead frame 1 on the heater 6. Thus, the lead frame 1 which is sticked with the punched insulating films 4 are obtained. Then, the insulating film-sticked lead frame 1 is processed to adhesively attached to a semiconductor chip for fabricating a semiconductor chip package.

Figure 2A:
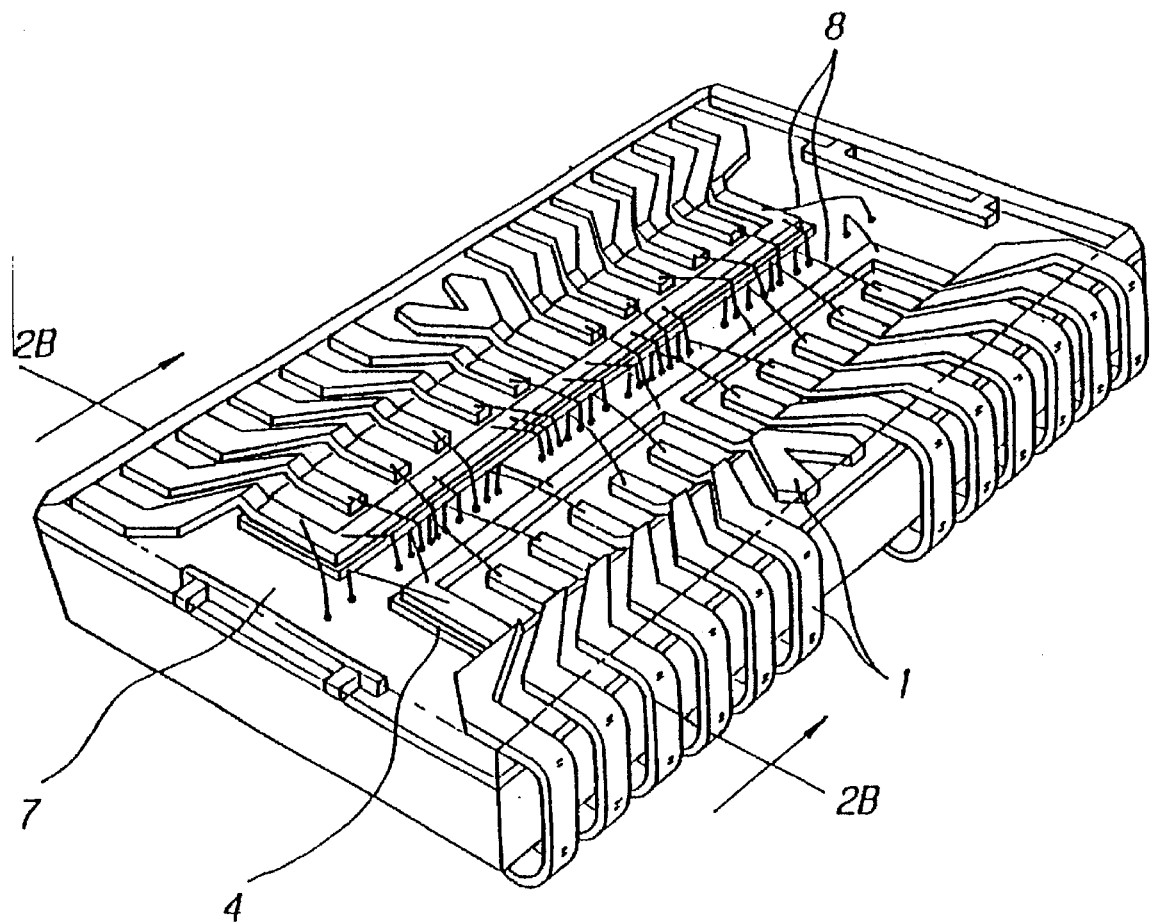
FIG. 2A is a perspective view showing a semiconductor chip package.
Figure 2B:
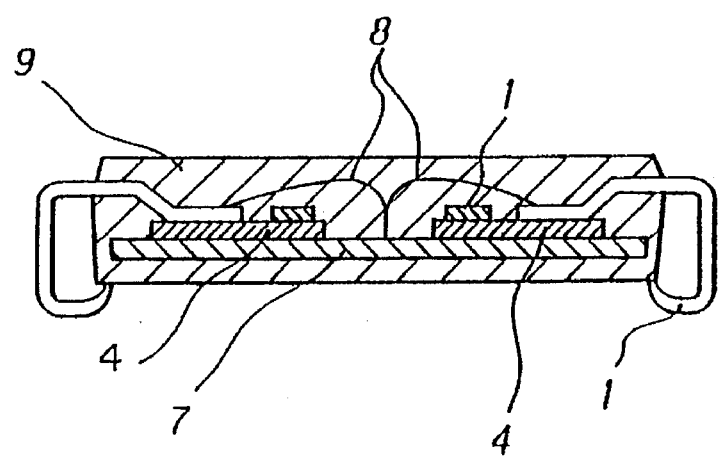
FIG. 2B is a cross-sectional view cut along the line 2B—2B in FIG. 2A.

FIGS. 2A and 2B show the semiconductor chip package thus fabricated. The semiconductor chip package comprises a semiconductor chip 7 having electrodes thereon, and a lead frame 1 sticked with punched insulating films 4, wherein the lead frame 1 is adhesively attached to the semiconductor chip 7 by the sticked insulating films 4, and a inner lead portion of the lead frame 1 is bonded to the electrodes by bonding wires 8, such that a whole structure of the semiconductor chip 7 is sealed to expose only an outer lead portion of the lead frame (1) by molding resin 9 (not shown in FIG. 2A, but in FIG. 2B). In the semiconductor chip package, the punched insulating films 4 are, for instance, polyimide films, on the both surfaces of which thermoplastic or thermosetting adhesives are layered to provide heat-proof characteristics of 250° to 400° C., as explained before. As understood from the illustration in FIGS. 2A and 2B, the position precision of the lead frame 1 on the semiconductor chip 7 must be high, because the inner leads must be precisely and stably bonded to the electrodes by the bonding wires 8. For this reason, the punched insulating films 4 must have the precision in dimension as high as possible. Therefore, the influence of thermal expansion of the punches 5 is required to be avoided in a method and an apparatus for sticking an insulating film to a lead frame.

FIG. 2C shows four kinds of punching burrs which occur in accordance with the influence of the thermal expansion of the punches, wherein the burr interrupts the bonding wire 8 to be bonded to an inner lead frame of the lead frame 1.

Figure 3:
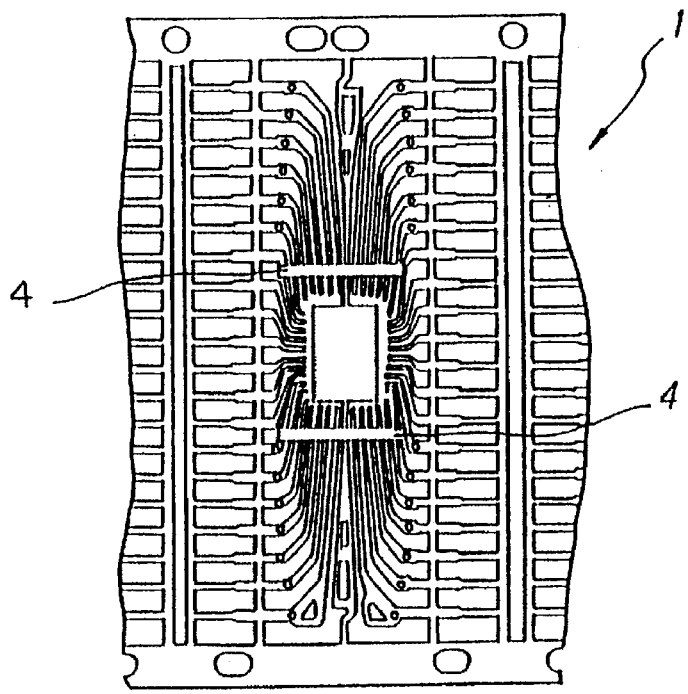
FIGS. 3 and 4 are plan views showing lead frames to which punched insulating films are sticked.
Figure 4:
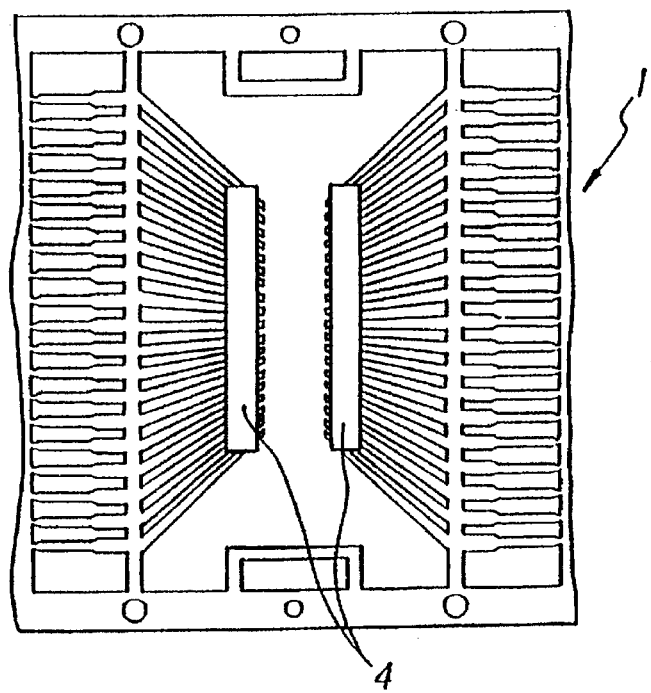

FIGS. 3 and 4 show lead frames 1, on inner leads of which punched insulating films 4 are sticked adhesively, as explained before. The insulating films 4 as shown in FIG. 3 is only required to have heat-proof characteristics of approximately 150° C., because the films 4 are not used for adhesively attaching the lead frame 1 to a semiconductor chip, but for avoiding the position level difference of the inner leads and the position shift of the inner leads. On the other hand, the insulating films 4 as shown in FIG. 4 are used for the aforementioned LOC package.

The lead frame 1 as shown in FIG. 3 is a lead frame of 42 Ni—Fe alloy having a thickness of 15 mm and 40 pins used for a DIP (Dual Inline Package), and the lead frame 1 as shown in FIG. 4 is a lead frame of 42 Ni—Fe alloy having a thickness of 0.25 mm and 40 pins used for a SOJ (Small Outline J-bend Package).

In order to avoid the deformation of the punched insulating film 4 at the time of being pressed on a lead frame 1 due to the large pressing force by a punch 5, as explained in FIG. 1, the spacer 54 is used to prevent the punch 5 from being lowered down to a predetermined level. However, it is troublesome to provide a plurality of spacers having different spacer lengths in a practical apparatus.

Next, an apparatus for sticking an insulating film to a lead frame in the first preferred embodiment will be explained in FIGS. 5A and 5B, wherein like parts are indicated by like reference numerals as used in FIG. 1.

Figure 6A:
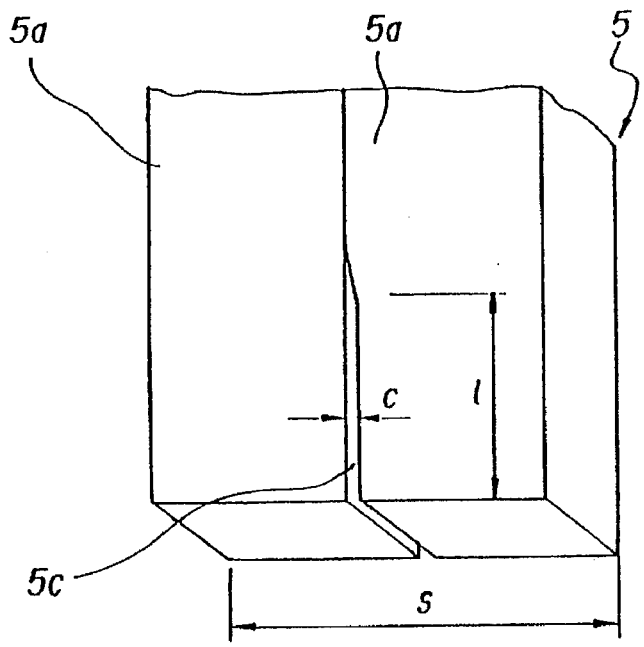
FIGS. 6A to 6D are explanatory views showing punches to be used in the first preferred embodiment.

In the first preferred embodiment, each of the punches 5 is composed of two divided punches 5a which are assembled on side planes to have a clearance 5c having a gap c and a length 1 for absorbing thermal expansion thereof, as shown in FIG. 6A.

In one experiment in which the divided punches 5a having a total width s of 18.5 mm are heated at 400° C. for one and half seconds by the heater 6 and cooled for one second, and this heat cycle is repeated by twenty times, it is detected that the divided punches 5a are increased in temperature at tip portions thereof to be approximately 100° C., but remain at a room temperature to be approximately 25° to 27° C. at a vertical point of 15 mm from the tip portions thereof. In accordance with the result, the length 1 of the clearance 5c is preferable to be 15 mm, so that the thermal expansion is effectively absorbed by the clearance 5c.

In another experiment in which an insulating film 4 is placed on the die 2 to be punched by the punches 5, as shown in FIGS. 5A and 5B, wherein the gap c of the clearance 5C between the divided punches 5a is changed to check the effect of absorbing the thermal expansion of the divided punches 5a and punching the insulating film 4 without resulting in fine deformations at edges of punched insulating films. As a result, it is confirmed that the gap c of the clearance 5c which is equal to or greater than 10 μm effectively absorbs the thermal expansion of the divided punches 5a, and equal to or less than 30 μm effectively suppresses the generation of fine deformations at edges of the punched insulating films. When the gap c of the clearance 5C is 50 μm, fine deformations are clearly observed at edges of the punched insulating films.

Figure 6C:
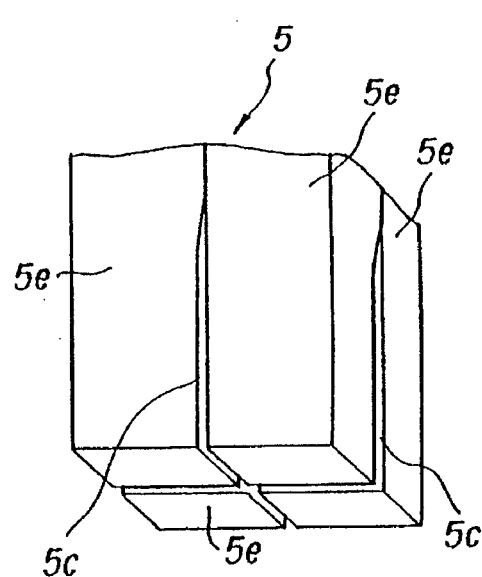
Figure 6B:
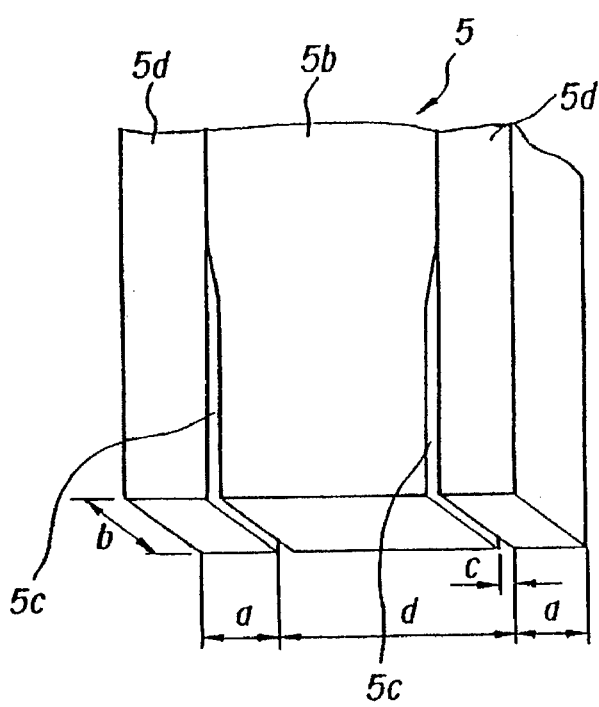
Figure 6D:
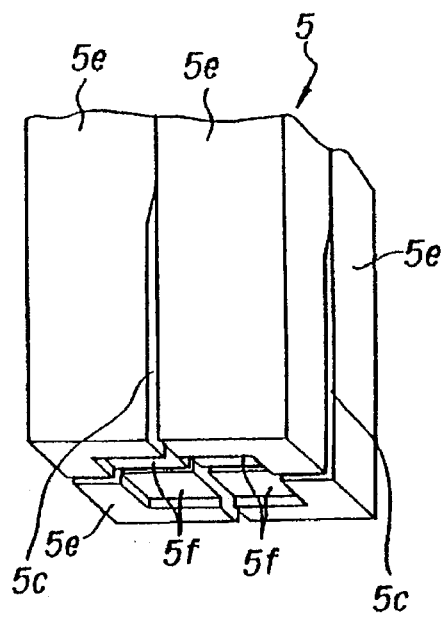

In the first preferred embodiment, the punch 5 as shown in FIG. 6A may be modified to be punches 5 as shown in FIGS. 6B to 6D.

In FIG. 6B, the punch 5 is composed of first and third divided punches 5d of a×b in dimension and a second divided punch 5b of d×b in dimension, wherein clearances 5c of a gap c are provided between the first and second divided punches 5d and 5b and the second and third divided punches 5b and 5d. In this punch 5, it is confirmed in an experiment that "a" is equal to or greater than "b", and "d" is greater than "b" to provide a predetermined mechanical strength. In practical, it is detected that, when "a" and "b" are 1.2 mm, and the gap c is 30 μm, the thermal expansion amount of the punch 5 is only approximately 3 μm. This means that the modified punch 5 is effective to absorb the thermal expansion.

In FIG. 6C, the punch 5 is composed of four divided punches 5e having clearances 5c of a gap c between each two of the divided punches 5e. In this structure, longitudinal and transversal thermal expansions are absorbed by the orthogonally arranged clearances 5c. It is confirmed in an experiment that the thermal expansion absorbing effect is increased, as the number of divided punches is increased, although the mechanical strength thereof which is correspondingly reduced must be considered.

In FIG. 6D, the punch 5 is composed of the four divided punches 5e having the clearances 5c of the gap c which are the same as those in FIG. 6C, while the divided punches 5e have recesses 5f on the tip planes on which punched insulating films 4 are adsorbed, as described before, by vacuum. In this structure, the punched insulating film 4 is not pressed on a lead frame 1 by the recesses 5f, but by remaining portions other than the recesses 5f of the divided punches 5e. For this structure, the punch 5 is advantageously applied to QFC lead frames, especially, COT lead frames, etc.

The punch 5 is not composed of divided punches, but may be one integral body provided with apertured clearances, and other modification may be added thereto.

In operation in the first preferred embodiment, an insulating film 4 is transferred on the die 2 by a transfer apparatus (not shown), and a lead frame 1 is transferred on the heater 6 by a transfer apparatus (not shown), as shown in FIG. 5A. Then, the punches 5 which are in the structure selected from those in FIG. 6A to 6D are lowered to punch the insulating film 4, so that the punched insulating films 4 adsorbed on the tip planes of the punches 5 are lowered on the lead frame 1 which is heated on the heater 6 to be a predetermined temperature, as shown in FIG. 5B. Thus, the punched insulating films 4 are sticked on an inner lead portion of the lead frame 1 by a predetermined pressing force appropriately generated by the punches 5 which are released from the influence of thermal expansion in accordance with the presence of the clearances 5c. Consequently, the sticking position of the punched insulating films 4 are remarkably high in precision.

An apparatus for sticking an insulating film to a lead frame in the second preferred embodiment according to the invention will be explained in FIGS. 7A to 7C, wherein like parts are indicated by like reference numerals as used in FIGS. 5A and 5B.

In the second preferred embodiment, the heater 6 is placed on a heater fixing plate 11 which is vertically moved by an air cylinder 12.

Figure 7A:
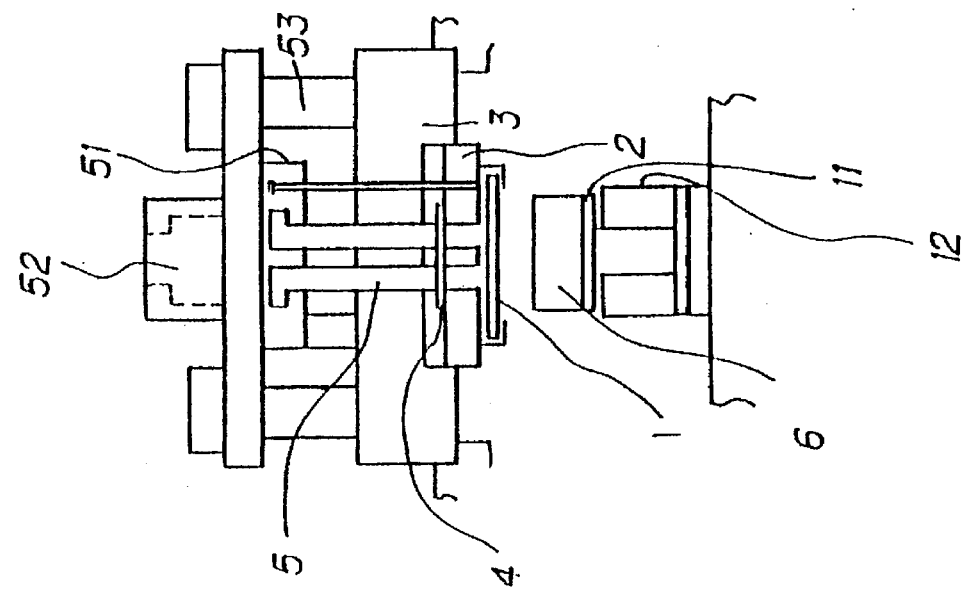
FIGS. 7A to 7C are explanatory views showing an apparatus for sticking an insulating film to a lead frame in a second preferred embodiment according to the invention.

In operation, an insulating film 4 having a width of 16.5 mm is transferred on the die 2 by a transfer apparatus (not shown), and a lead frame 1 is transferred above the heater 6 by a transfer apparatus (not shown), as shown in FIG. 7A. In case of the lead frame 1 as shown in FIG. 3, the insulating film 4 is composed of a polyimide film of 50 μm in thickness and acryle-based thermosetting adhesive layers each having a thickness of 20 μm coated on the both surfaces of the poliamide film, and a temperature at which the insulating films 4 are sticked to the lead frame 1 is 170° C.

On the other hand, in case of the lead frame 1 as shown in FIG. 4, the insulating film 4 is composed of a polyimide film of 50 μm in thickness and polyether amideimide adhesive layers each having a thickness of 20μ coated on the both surfaces of the polyimide films, and a temperature at which the insulating films 4 are sticked to the lead frame 1 is 340° C.

Figure 7B:
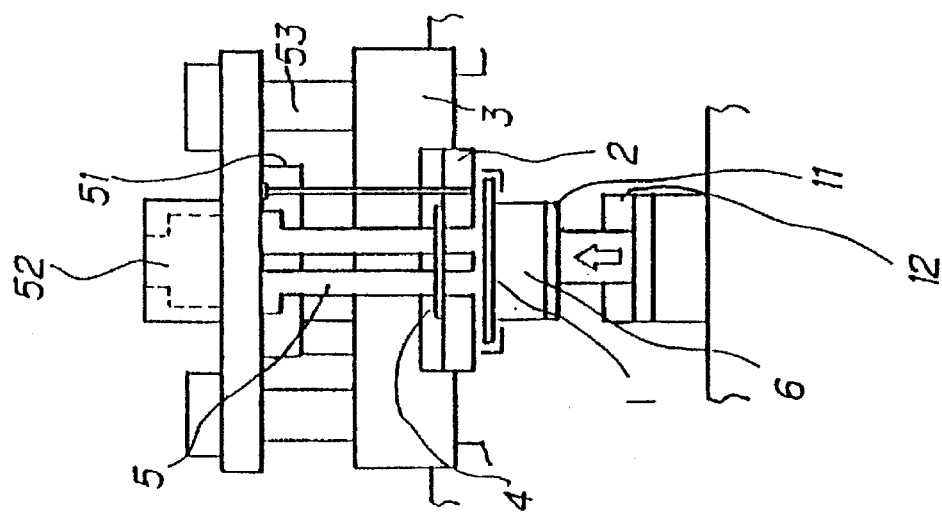

In FIG. 7B, the heater 6 is moved up to contact with the lead frame 1 which is thereby heated to be the above described sticking temperature.

Figure 7C:
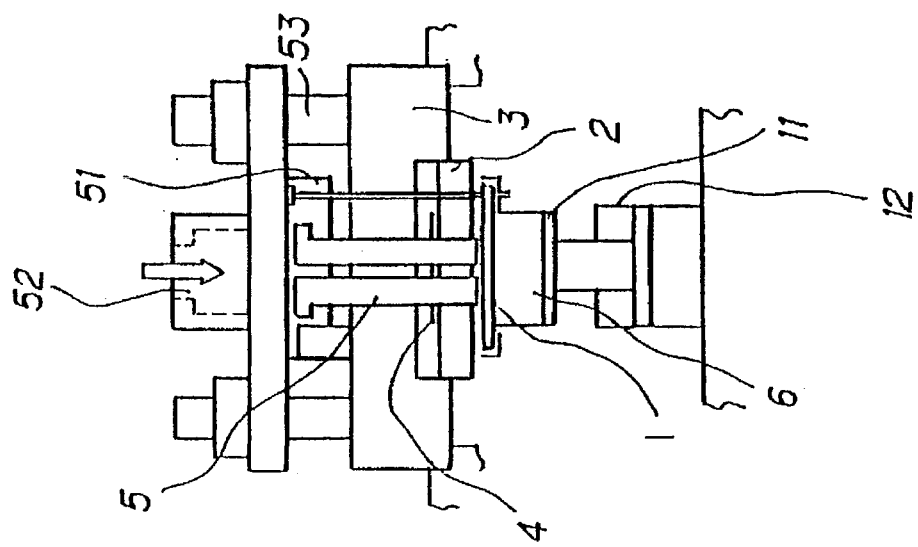

In FIG. 7C, the punches 5 are moved down to punch the insulating film 1, so that the punched insulating films 4 are sticked to the lead frame 1.

In the second preferred embodiment, even if thicknesses of the lead frame 1 and/or the insulating film 4 are changed and/or deviated, a pressing force by which the insulating films 4 are sticked to the lead frame 1 is kept constant, because a position level of the heater 6 is changed by means of the air cylinder 12.

In the second preferred embodiment, the punches 5 may be one selected from the structures as shown in FIGS. 6A to 6D.

In the second preferred embodiment, polyether-amideimide adhesive may be replaced by polyether-amide or polyether-imide adhesive, and polyimide film may be replaced by other heat-proof films.

In the first and second preferred embodiments, an insulating film composed of a heat-proof base film and adhesive layers may be replaced by an adhesive film composed of only one adhesive layer.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for sticking an insulating film to a lead frame comprising the steps of:
   providing a punch for punching a thermally adhesive insulating film, said punch having a clearance within it for absorbing thermal expansion thereof;
   punching said thermally adhesive insulating film to provide a punched film by said punch;
   heating a lead frame placed on a heater by said heater; and
   pressing said punched film to said lead frame on said heater by said punch, thereby sticking said punched film to said lead frame
   wherein thermal expansion of said punch occurring as a result of carrying out the step of heating said lead frame is absorbed by said clearance of said punch.

2. A method for sticking an insulating film to a lead frame according to claim 1, wherein:
   said pressing step is carried out in a state where said heater is mounted on a heater fixing plate on an air cylinder.

* * * * *